United States Patent

[11] 3,584,267

[72] Inventors Ralph A. Logan
Morristown;
Harry G. White, Somerset, both of, N.J.
[21] Appl. No. 833,232
[22] Filed Apr. 15, 1969
[45] Patented June 8, 1971
[73] Assignee Bell Telephone Laboratories, Incorporated
Berkeley Heights, N.J.
Division of Ser. No. 616,966, Feb. 17, 1967, Pat. No. 3,470,038. This application Apr. 15, 1969, Ser. No. 833,232

[54] GALLIUM PHOSPHIDE ELECTROLUMINESCENT JUNCTION DEVICE
2 Claims, 3 Drawing Figs.

[52] U.S. Cl. .......... 317/234, 317/235, 313/108, 148/176
[51] Int. Cl. .......... H01l 15/00
[50] Field of Search .......... 317/235/27; 148/176

[56] References Cited

OTHER REFERENCES

M. Gershenzon, Bell System Technical Journal, Nov. 1966, pps. 1599— 1609. Presented at IEEE at Stevens Institute of Technology, May 11, 1966

*Primary Examiner*—John W. Huckert
*Assistant Examiner*—Martin H. Edlow
*Attorneys*—R. J. Guenther and Edwin B. Cave ABSTRACT: High efficiency gallium phosphide electroluminescent PN junction devices capable of emitting visible light at room temperature are prepared by depositing an epitaxial layer of N-type gallium phosphide by conventional techniques upon a solution grown P-type gallium phosphide crystal and annealing the resultant junction at temperatures ranging from 450°—725° C.

INVENTORS R. A. LOGAN
H. G. WHITE
BY Edward M. Fink
ATTORNEY

GALLIUM PHOSPHIDE ELECTROLUMINESCENT JUNCTION DEVICE

This application is a division of copending application, Ser. No. 616,966, filed Feb. 17, 1967, now Pat. No. 3,470,038.

This invention relates to a technique for the fabrication of PN junction devices. More particularly, the present invention relates to a technique for the fabrication of a gallium phosphide PN electroluminescent junction device capable of emitting visible light at room temperature.

Recently, there has been a birth of interest in a class of PN junction devices evidencing visible light emission at room temperature under forward bias conditions. Heretofore, devices of this type has been found to manifest room temperature external quantum efficiencies ranging from approximately 0.02—0.7 percent. Although such devices have proven satisfactory in many applications, a definite need exists in telephony applications for enhancing efficiency levels in order to provide the greatest light output at the current levels commonly encountered in telephone loop circuitry.

In accordance with the present invention, a technique is described for appreciably enhancing room temperature electroluminescence quantum efficiencies of gallium phosphide PN junction devices. The inventive technique involves growth of an N-type gallium phosphide layer upon a P-type solution grown gallium phosphide seed by conventional liquid phase epitaxy techniques and the subsequent annealing of the resultant structure at elevated temperatures. Gallium phosphide junctions prepared in accordance with the described technique have been found to emit red light at room temperature with an electroluminescence quantum efficiency greater than 1 percent over the range of 1.5 to 2.1 electron volts (5000 to 9000 A.) under forward bias conditions.

Figure 1A:
Figure 1B:
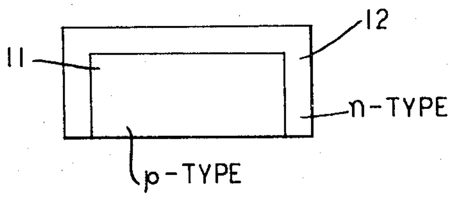
Figure 1C:
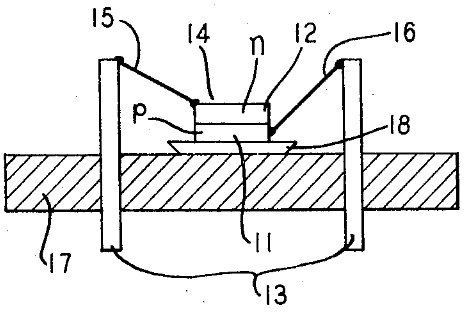

The invention will be more readily understood by reference to the following detailed description taken in conjunction with the accompanying drawing, wherein:

FIGS. 1A through 1C are cross-sectional views in successive stages of manufacture of an electroluminescent junction device of the present invention.

With reference now to the techniques employed herein, a P-type gallium phosphide seed or substrate is initially prepared by conventional solution growth techniques. Typically, this end is attained by placing a suitable charge of gallium in a silica tube or other suitable vessel and heated under vacuum to a temperature sufficient to form a melt. Next, the vessel is removed from the vacuum system and gallium phosphide together with the requisite amount of the desired dopant are added.

Following, the vessel and its contents are evacuated and sealed under vacuum. Then the mixture is heated to a temperature above its melting point and maintained thereat for a time period ranging from 1—12 hours. Thereafter, the temperature of the tube and its contents are lowered at a rate ranging from ½ to 60° C. per hour to about 900° C., the heating unit being turned off at that point and the vessel permitted to cool to room temperature.

The desired P-type gallium phosphide crystals may then be recovered by any conventional procedure, as for example, by digestion in nitric acid or hydrochloric acid. The resultant P-type solution grown gallium phosphide crystal 11 is shown in FIG. 1A.

It will be understood by those skilled in the art that any of the well-known dopants may be added with the gallium phosphide, for example, zinc, oxygen, tellurium, etc. in order to control the conductivity type of the resultant mixture.

A suitable P-type gallium phosphide crystal having been prepared, the next step in the inventive procedure involves the growth of an N-type gallium phosphide layer 12 (FIG. 1B) by conventional solution epitaxy techniques. Typically, this end may be attained by positioning the seed crystal at one end of a suitable boat, the other end of the boat containing a mixture of gallium and gallium phosphide together with an appropriate donor, generally tellurium. The boat is usually enclosed in a quartz tube and held in an atmosphere of forming gas at elevated temperatures so as to form a saturated gallium solution which is then flowed over the seed crystal by tipping the boat. Following, the system is cooled and the seed crystal bearing an epitaxially grown N-type gallium phosphide layer is isolated by digestion in a suitable acid solution.

Thereafter, the resultant structure is heated at a temperature within the range of 450°—725° C. for a time period ranging from 5—30 hours. Heating may be effected in air, vacuum or an inert ambient such as argon. It has been found that the use of temperatures appreciably less then 450° C. fail to result in any beneficial enhancement in efficiency, the upper limit of 725° C. being dictated by practical considerations.

After growth of the junction and annealing as described, the resultant wafer diode shown in FIG. 1B is lapped down to a suitable thickness and ohmic contacts applied thereto by conventional techniques. Typically, this end is attained by simultaneously alloying a gold-zinc alloy into the P-side of the wafer and tin into the N-side in a stream of hydrogen. Contact to the N-side is attained by soldering a gold wire to the tin thereon. Shown in FIG. 1C is a cross-sectional view of the structure of FIG. 1B mounted upon a suitable header 13. Ohmic contact is made to the N-side by means of tin alloy 14 and gold wire 15 and to the P-side by means of zinc-gold alloy wire 16. Absorption of emitted light by poorly reflecting metal surfaces is prevented by use of glass base 17 in the header instruction, the diode being cemented to glass base 17 by means of a suitable resin 18 having an index of refraction which aids the emergence of light. An example of the present invention is described in detail below. The example is included merely to aid in the understanding of the invention, and variations may be made by one skilled in the art without departing from the spirit and scope of the invention.

EXAMPLE

A gallium phosphide PN junction device was prepared as follows:

12.5 grams of gallium were placed on a silica tube and heated under vacuum to about 600° C. The tube was then removed from the vacuum system and 1.5 grams of gallium phosphide, 8.2 milligrams of zinc, and 6.7 milligrams of gallium oxide added to the resultant solution. Next, the tube was evacuated, sealed under vacuum and placed in a furnace wherein the temperature of the tube and its contents were elevated to the melting point thereof (1180° C.). The resultant melt was maintained at this temperature for two hours. Thereafter, the temperature of the tube and its contents were lowered at 5° C. per hour to 900° C., at which point the furnace was turned off and the vessel permitted to cool to room temperature. The resultant P-type gallium phosphide crystal 250×300×mils in thickness was recovered by digestion in nitric acid.

Next, a charge comprising two grams of gallium, 0.2 grams of gallium phosphide, and 0.0036 gram of tellurium (1 atom percent) were inserted at one end of a pyrolitically fired graphite boat enclosed in a quartz tube, the entire assembly being housing in a furnace. The P-type gallium phosphide seed crystal was next polished by conventional polishing techniques, etched for 15 seconds in aqua regia and placed at the opposite end of the boat form the charge. The entire assembly was then heated to 1060° C. in a forming gas ambient, the charge and substrate being maintained separate. At this point, the furnace was tilted so that the now molten charge ran onto the substrate. The furnace was then cooled to 500° C., the quartz tube removed and the boat and its contents permitted to cool to room temperature.

Following, the gallium phosphide P-type seed crystal having deposited thereon an epitaxial layer of N-type gallium phosphide was recovered by digestion in nitric acid. The resultant structure was then broken into two crystals, one of which was annealed in air at 720° C. for 16 hours. Ohmic contacts to the resultant crystals were made by simultaneously alloying a gold-zinc wire into the P-side and by alloying tin into the N-side of the crystal in a stream of hydrogen, contact to the tin being made by soldering a gold wire thereto. The resultant structures were mounted in a header similar to that shown in FIG. 1C.

In order to demonstrate the efficacy of the resultant devices, the leads were connected to a DC source under forward bias conditions, the plus lead to the P-region and the minus lead to the N-region. At room temperature, at voltages ranging from 1.8 to 1.9 volts, the annealed device was found to carry from $10^{13}$ to $10^{12}$ amperes accompanied by the emission of red light centered at about 1.78 electron volts (7000 A.) encompassing the range from 1.5 to 2.1 electron volts (5000 to 9000 A.). The measured external quantum efficiency as determined by means of a calibrated solar cell was found to be 2.1 percent. The unannealed device was found to evidence an efficiency of 0.26 percent.

What we claim is:

1. Electroluminescent PN junction device comprising an annealed structure comprising a region of solution grown P-type gallium phosphide and an epitaxial layer of N-type gallium phosphide in intimate contact therewith, current means for producing visible light at room temperature with an electroluminescence quantum efficiency greater than 1 percent over the range of 1.5—2.1 electron volts under forward bias conditions.

2. A device in accordance with claim 1 capable of emitting red light.